US009443970B2

(12) United States Patent
Hou et al.

(10) Patent No.: US 9,443,970 B2
(45) Date of Patent: Sep. 13, 2016

(54) SEMICONDUCTOR DEVICE WITH EPITAXIAL STRUCTURES AND METHOD FOR FABRICATING THE SAME

(71) Applicant: UNITED MICROELECTRONICS CORPORATION, Hsinchu (TW)

(72) Inventors: Hsin-Ming Hou, Tainan (TW); Yu-Cheng Tung, Kaohsiung (TW); Ji-Fu Kung, Taichung (TW); Wai-Yi Lien, Hsinchu (TW); Ming-Tsung Chen, Tainan (TW)

(73) Assignee: UNITED MICROELECTRONICS CORPORATION, Hsinchu (TW)

( * ) Notice: Subject to any disclaimer, the term of this patent is extended or adjusted under 35 U.S.C. 154(b) by 0 days.

(21) Appl. No.: 14/924,734

(22) Filed: Oct. 28, 2015

(65) Prior Publication Data

US 2016/0049506 A1 Feb. 18, 2016

Related U.S. Application Data

(62) Division of application No. 13/419,530, filed on Mar. 14, 2012, now Pat. No. 9,202,914.

(51) Int. Cl.
*H01L 29/78* (2006.01)
*H01L 21/336* (2006.01)
*H01L 21/762* (2006.01)
*H01L 29/66* (2006.01)

(52) U.S. Cl.
CPC ......... *H01L 29/78* (2013.01); *H01L 21/76224* (2013.01); *H01L 29/7848* (2013.01); *H01L 29/6653* (2013.01); *H01L 29/6656* (2013.01); *H01L 29/66628* (2013.01); *H01L 29/66636* (2013.01)

(58) Field of Classification Search
CPC ............. H01L 29/78; H01L 21/76224; H01L 29/6653; H01L 29/7848
See application file for complete search history.

(56) References Cited

U.S. PATENT DOCUMENTS

| 4,891,303 A | 1/1990 | Garza |
| 5,217,910 A | 6/1993 | Shimizu |
| 5,273,930 A | 12/1993 | Steele |
| 5,356,830 A | 10/1994 | Yoshikawa |
| 5,372,957 A | 12/1994 | Liang |
| 5,385,630 A | 1/1995 | Philipossian |
| 5,399,506 A | 3/1995 | Tsukamoto |
| 5,625,217 A | 4/1997 | Chau |
| 5,777,364 A | 7/1998 | Crabbe |
| 5,783,478 A | 7/1998 | Chau |
| 5,783,479 A | 7/1998 | Lin |

(Continued)

*Primary Examiner* — Thomas L Dickey
*Assistant Examiner* — Damon Hillman
(74) *Attorney, Agent, or Firm* — Ding Yu Tan (57) ABSTRACT

A semiconductor device including a substrate, a plurality of isolation structures, at least a gate structure, a plurality of dummy gate structures and a plurality of epitaxial structures is provided. The substrate has an active area defined by the isolation structures disposed within the substrate. That is, the active area is defined between the isolation structures. The gate structure is disposed on the substrate and located within the active area. The dummy gate structures are disposed on the substrate and located out of the active area. The edge of each dummy gate structure is separated from the boundary of the active area with a distance smaller than 135 angstroms. The epitaxial structures are disposed within the active area and in a portion of the substrate on two sides of the gate structure. The invention also provided a method for fabricating semiconductor device.

11 Claims, 8 Drawing Sheets

(56) References Cited

U.S. PATENT DOCUMENTS

| | | |
|---|---|---|
| 5,960,322 A | 9/1999 | Xiang |
| 6,030,874 A | 2/2000 | Grider |
| 6,048,756 A | 4/2000 | Lee |
| 6,074,954 A | 6/2000 | Lill |
| 6,100,171 A | 8/2000 | Ishida |
| 6,110,787 A | 8/2000 | Chan |
| 6,165,826 A | 12/2000 | Chau |
| 6,165,881 A | 12/2000 | Tao |
| 6,191,052 B1 | 2/2001 | Wang |
| 6,228,730 B1 | 5/2001 | Chen |
| 6,274,447 B1 | 8/2001 | Takasou |
| 6,303,418 B1 | 10/2001 | Cha |
| 6,355,533 B2 | 3/2002 | Lee |
| 6,365,476 B1 | 4/2002 | Talwar |
| 6,368,926 B1 | 4/2002 | Wu |
| 6,444,591 B1 | 9/2002 | Schuegraf |
| 6,537,370 B1 | 3/2003 | Hernandez |
| 6,544,822 B2 | 4/2003 | Kim |
| 6,605,498 B1 | 8/2003 | Murthy |
| 6,613,695 B2 | 9/2003 | Pomarede |
| 6,621,131 B2 | 9/2003 | Murthy |
| 6,624,068 B2 | 9/2003 | Thakar |
| 6,632,718 B1 | 10/2003 | Grider |
| 6,642,122 B1 | 11/2003 | Yu |
| 6,664,156 B1 | 12/2003 | Ang |
| 6,676,764 B2 | 1/2004 | Joo |
| 6,699,763 B2 | 3/2004 | Grider |
| 6,703,271 B2 | 3/2004 | Yeo |
| 6,777,275 B1 | 8/2004 | Kluth |
| 6,806,151 B2 | 10/2004 | Wasshuber |
| 6,809,402 B1 | 10/2004 | Hopper |
| 6,858,506 B2 | 2/2005 | Chang |
| 6,861,318 B2 | 3/2005 | Murthy |
| 6,864,135 B2 | 3/2005 | Grudowski |
| 6,869,867 B2 | 3/2005 | Miyashita |
| 6,887,751 B2 | 5/2005 | Chidambarrao |
| 6,887,762 B1 | 5/2005 | Murthy |
| 6,891,192 B2 | 5/2005 | Chen |
| 6,930,007 B2 | 8/2005 | Bu |
| 6,946,350 B2 | 9/2005 | Lindert |
| 6,962,856 B2 | 11/2005 | Park |
| 6,972,461 B1 | 12/2005 | Chen |
| 6,991,979 B2 | 1/2006 | Ajmera |
| 6,991,991 B2 | 1/2006 | Cheng |
| 7,037,773 B2 | 5/2006 | Wang |
| 7,060,576 B2 | 6/2006 | Lindert |
| 7,060,579 B2 | 6/2006 | Chidambaram |
| 7,112,495 B2 | 9/2006 | Ko |
| 7,118,952 B2 | 10/2006 | Chen |
| 7,132,338 B2 | 11/2006 | Samoilov |
| 7,169,675 B2 | 1/2007 | Tan |
| 7,183,596 B2 | 2/2007 | Wu |
| 7,202,124 B2 | 4/2007 | Fitzgerald |
| 7,217,627 B2 | 5/2007 | Kim |
| 7,288,822 B1 | 10/2007 | Ting |
| 7,303,999 B1 | 12/2007 | Sriraman |
| 7,335,959 B2 | 2/2008 | Curello |
| 7,388,263 B2 | 6/2008 | Doong et al. |
| 7,410,859 B1 | 8/2008 | Peidous |
| 7,462,239 B2 | 12/2008 | Brabant |
| 7,491,615 B2 | 2/2009 | Wu |
| 7,494,856 B2 | 2/2009 | Zhang |
| 7,494,858 B2 | 2/2009 | Bohr |
| 7,592,231 B2 | 9/2009 | Cheng |
| 7,667,227 B2 | 2/2010 | Shimamune |
| 7,691,752 B2 | 4/2010 | Ranade |
| 7,838,370 B2 | 11/2010 | Mehta |
| 7,875,516 B2 | 1/2011 | Knoefler |
| 7,932,566 B2 | 4/2011 | Hou et al. |
| 2002/0160587 A1 | 10/2002 | Jagannathan |
| 2002/0182423 A1 | 12/2002 | Chu |
| 2003/0181005 A1 | 9/2003 | Hachimine |
| 2003/0203599 A1 | 10/2003 | Kanzawa |
| 2004/0045499 A1 | 3/2004 | Langdo |
| 2004/0067631 A1 | 4/2004 | Bu |
| 2004/0227164 A1 | 11/2004 | Lee |
| 2005/0070076 A1 | 3/2005 | Dion |
| 2005/0079692 A1 | 4/2005 | Samoilov |
| 2005/0082616 A1 | 4/2005 | Chen |
| 2005/0139231 A1 | 6/2005 | Abadie |
| 2005/0260830 A1 | 11/2005 | Kwon |
| 2005/0285193 A1 | 12/2005 | Lee |
| 2005/0287752 A1 | 12/2005 | Nouri |
| 2006/0051922 A1 | 3/2006 | Huang |
| 2006/0057859 A1 | 3/2006 | Chen |
| 2006/0076627 A1 | 4/2006 | Chen |
| 2006/0088968 A1 | 4/2006 | Shin |
| 2006/0115949 A1 | 6/2006 | Zhang |
| 2006/0163558 A1 | 7/2006 | Lee |
| 2006/0228842 A1 | 10/2006 | Zhang |
| 2006/0231826 A1 | 10/2006 | Kohyama |
| 2006/0258126 A1 | 11/2006 | Shiono |
| 2006/0281288 A1 | 12/2006 | Kawamura |
| 2006/0292779 A1 | 12/2006 | Chen |
| 2006/0292783 A1 | 12/2006 | Lee |
| 2007/0023847 A1 | 2/2007 | Rhee |
| 2007/0034906 A1 | 2/2007 | Wang |
| 2007/0049014 A1 | 3/2007 | Chen |
| 2007/0072353 A1 | 3/2007 | Wu |
| 2007/0072376 A1 | 3/2007 | Chen |
| 2007/0082451 A1 | 4/2007 | Samoilov |
| 2007/0093032 A1* | 4/2007 | Kobayashi ............ C23C 16/401 438/299 |
| 2007/0128783 A1 | 6/2007 | Ting |
| 2007/0166929 A1 | 7/2007 | Matsumoto |
| 2007/0262396 A1 | 11/2007 | Zhu |
| 2008/0014688 A1 | 1/2008 | Thean |
| 2008/0061366 A1 | 3/2008 | Liu |
| 2008/0067545 A1 | 3/2008 | Rhee |
| 2008/0076236 A1 | 3/2008 | Chiang |
| 2008/0085577 A1 | 4/2008 | Shih |
| 2008/0116525 A1 | 5/2008 | Liu |
| 2008/0124874 A1 | 5/2008 | Park |
| 2008/0128746 A1 | 6/2008 | Wang |
| 2008/0142886 A1 | 6/2008 | Liao |
| 2008/0220579 A1 | 9/2008 | Pal |
| 2008/0233722 A1 | 9/2008 | Liao |
| 2008/0233746 A1 | 9/2008 | Huang |
| 2009/0039389 A1 | 2/2009 | Tseng |
| 2009/0045456 A1 | 2/2009 | Chen |
| 2009/0095992 A1 | 4/2009 | Sanuki |
| 2009/0117715 A1 | 5/2009 | Fukuda |
| 2009/0124056 A1 | 5/2009 | Chen |
| 2009/0166625 A1 | 7/2009 | Ting |
| 2009/0166676 A1* | 7/2009 | Lee ................... H01L 29/7848 257/192 |
| 2009/0184402 A1 | 7/2009 | Chen |
| 2009/0186475 A1 | 7/2009 | Ting |
| 2009/0246922 A1 | 10/2009 | Wu |
| 2009/0278170 A1 | 11/2009 | Yang |
| 2009/0302348 A1 | 12/2009 | Adam |
| 2010/0001317 A1 | 1/2010 | Chen |
| 2010/0093147 A1 | 4/2010 | Liao |
| 2011/0012231 A1 | 1/2011 | Amishiro |
| 2012/0091539 A1 | 4/2012 | Fan |
| 2012/0217583 A1 | 8/2012 | Zhu |
| 2013/0095627 A1* | 4/2013 | Flachowsky .... H01L 21/823807 438/285 |

* cited by examiner

SEMICONDUCTOR DEVICE WITH EPITAXIAL STRUCTURES AND METHOD FOR FABRICATING THE SAME

BACKGROUND

1. Technical Field

The present invention relates to a semiconductor device and a method for fabricating the same, more particularly to a semiconductor device with symmetric epitaxial structures and a method for fabricating the same.

2. Description of the Related Art

With the development of the semiconductor technology, the speed of transistors is unceasingly increased. However, the speed of transistor is still limited to the mobility of electrons and holes in the silicon channels. Accordingly, one way to improve the device performance is to adjust the mechanical stresses of the channels and thereby raise the mobility of electrons and holes in the channels.

A prior-art method of adjusting the mechanical stress is to form a strained semiconductor material, such as silicon germanium alloy (SiGe), as the major material of source/drain (S/D) regions. The method includes removing portions of the substrate at the predetermined positions of the S/D regions to form trenches and then filling SiGe into the trenches with selective epitaxial growth (SEG). Because the effective electron mass and the effective hole mass are smaller in germanium than in silicon, the mobility of electrons and holes can be raised by forming the S/D regions mainly from SiGe. Thereby, the performance of the device can be improved.

However, if the epitaxial structures formed at two sides of the gate of a transistor are asymmetric, the transistor can not gain an appropriate stress effect therefrom.

BRIEF SUMMARY

The invention is direct to a method for fabricating a semiconductor device with symmetric epitaxial structures.

The invention is also direct to a semiconductor device with symmetric epitaxial structures.

The invention provides a method for fabricating a semiconductor device. First, a substrate with a plurality of isolation structures formed therein is provided, and an active area of the substrate is defined by the isolation structures. That is, the active area is surrounded by the isolation structures and has a first width W1. Second, at least one gate structure and a plurality of dummy gate structures are formed on the substrate. The gate structure is located in the active area and has a second width W2. At least one portion of each dummy gate structure is located on the corresponding one of the isolation structures and separated from the gate structure with a distance D. Further, the first width W1, the second width W2 and the distance D satisfy the inequality: W1≥W2+2D. Then, a plurality of epitaxial structures are formed in the substrate on two sides of the gate structure and between the gate structure and the dummy gate structures.

In one embodiment of present invention, each dummy gate structure has a third width W3 greater than the second width W2.

In one embodiment of present invention, wherein the gate structure is formed by forming a gate stacked pattern on the substrate first, and then a sidewall insulating layer is formed on the sidewalls of the gate stacked pattern.

In one embodiment of present invention, the isolation structures are protrusive from the substrate with a step height, and when W1>W2+2D, a width of a portion of each dummy gate structure overlapping the active area is equal to or greater than three times the step height. Further, a width of another portion of each dummy gate structure non-overlapping the active area is also, for example, equal to or greater than three times the step height.

In one embodiment of present invention, before forming the epitaxial structures, a sacrificed material layer is formed on the substrate and covering the gate structure. After that, a portion of the sacrificed material layer is removed to form a sacrificed spacer on the sidewalls of the gate structure. Then, a portion of the substrate beside the sacrificed spacer is removed to form a plurality of trenches. Accordingly, the epitaxial structures are disposed in the trenches.

In one embodiment of present invention, the portion of the sacrificed material layer and the portion of the substrate are removed by using the same process for forming the sacrificed spacer and the trenches at the same time.

In one embodiment of present invention, the method of forming the epitaxial structures further includes the steps of forming an epitaxial buffer layer and an epitaxial bulk layer sequentially in each trench.

In one embodiment of present invention, the method of forming the epitaxial structures further includes doping the epitaxial bulk layers.

In one embodiment of present invention, the method of forming the epitaxial structures further includes doping the epitaxial buffer layers, and the doping concentration of the epitaxial buffer layers is smaller than that of the epitaxial bulk layers.

In one embodiment of present invention, the method of forming the epitaxial structures further includes forming an epitaxial cap layer in each epitaxial bulk layer.

In one embodiment of present invention, the method of forming the semiconductor device further includes forming a spacer on the sidewalls of the gate structure and forming a source region and a drain region in the epitaxial structures respectively by using the spacer and the gate structure as a mask.

The invention also provides a semiconductor device including a substrate, a plurality of isolation structures, at least a gate structure, a plurality of dummy gate structures and a plurality of epitaxial structures is provided. The substrate has an active area with a first width W1 defined by the isolation structures disposed within the substrate. That is, the active area is surrounded by the isolation structures. The gate structure with a second with W2 is disposed on the substrate and located within the active area. The dummy gate structures are disposed on the substrate and partly covering the isolation structures, each dummy gate structure is separated from the gate structure with a distance D. Moreover, the first width W1, the second width W2 and the distance D satisfying an inequality: W1 W2+2D. The epitaxial structures are disposed within the active area and in a portion of the substrate on two sides of the gate structure.

In one embodiment of present invention, each dummy gate structure has a third width W3 greater than the second width W2.

In one embodiment of present invention, the gate structure includes a gate stacked pattern and a side insulating layer. The gate stacked pattern is disposed on the substrate and the side insulating layer is disposed on the sidewalls of the gate stacked pattern.

In one embodiment of present invention, the isolation structures are protrusive from the substrate with a step height, and when W1>W2+2D, a width of a portion of each dummy gate structure overlapping the active area is equal to or greater than three times the step height. Further, a width of another portion of each dummy gate structure non-overlapping the active area is also, for example, equal to or greater than three times the step height.

In one embodiment of present invention, the substrate further has a plurality of trenches. The epitaxial structures are disposed in the trenches. Moreover, each epitaxial structure includes an epitaxial buffer layer and an epitaxial bulk layer sequentially disposed in the corresponding trench.

In one embodiment of present invention, the doping concentration of the epitaxial buffer layers is smaller than that of the epitaxial bulk layers.

In one embodiment of present invention, each epitaxial structure further includes an epitaxial cap layer disposed on the epitaxial bulk layer.

In one embodiment of present invention, the semiconductor device further includes a spacer, a source region and a drain region. The spacer is formed on the sidewalls of the gate structure, and the source region and the drain region are formed in the epitaxial structures respectively.

The invention provides a method for fabricating a semiconductor device. First, a substrate with a plurality of isolation structures formed therein is provided, and an active area of the substrate is defined by the isolation structures. That is, the active area is surrounded by the isolation structures. Second, at least one gate structure and a plurality of dummy gate structures are formed on the substrate. The gate structure is located in the active area and the dummy gate structures are located out of the active area and the edges of the dummy gate structures are separated from the boundary of the active area with a distance smaller than 135 angstroms. Then, a plurality of epitaxial structures are formed in the substrate on two sides of the gate structure and between the gate structure and the dummy gate structures.

In one embodiment of present invention, the width of each dummy gate structure is greater than that of the gate structure.

The invention further provides a semiconductor device including a substrate, a plurality of isolation structures, at least a gate structure, a plurality of dummy gate structures and a plurality of epitaxial structures is provided. The substrate has an active area defined by the isolation structures disposed within the substrate. That is, the active area is defined between the isolation structures. The gate structure is disposed on the substrate and located within the active area. The dummy gate structures are disposed on the substrate and located out of the active area. The edge of each dummy gate structure is separated from the boundary of the active area with a distance smaller than 135 angstroms. The epitaxial structures are disposed within the active area and in a portion of the substrate on two sides of the gate structure.

In one embodiment of present invention, the width of each dummy gate structure is greater than that of the gate structure.

Since the distance between the dummy gate structures and the active area of the semiconductor device of one embodiment of the invention is smaller than 135 angstroms, alternatively, the dummy gate structures cross on the border between the active area and the isolation structures, during the process for forming the epitaxial structures beside the gate structure, the dummy gate structures can used for protecting the isolation structures from over-etching at the border between the active area and the isolation structures. Accordingly, it is not only that the symmetric trenches on two sides of the gate structure can be formed, but the symmetric epitaxial structures also can be formed in the trenches. Therefore, the operation performance of the semiconductor device can be improved These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

These and other features and advantages of the various embodiments disclosed herein will be better understood with respect to the following description and drawings, in which like numbers refer to like parts throughout, and in which.

DETAILED DESCRIPTION

Hereinafter, preferred embodiments of the present invention will be described in detail with reference to the accompanying drawings. Here, it is to be noted that the present invention is not limited thereto. Furthermore, the step serial numbers concerning the saturation adjustment method are not meant thereto limit the operating sequence, and any rearrangement of the operating sequence for achieving same functionality is still within the spirit and scope of the invention. The like numbered numerals designate similar or the same parts, regions or elements. It is to be understood that the drawings are not drawn to scale and are served only for illustration purposes.

A transistor would be described in the following paragraphs as an example to explain the invention, but it is not limited hereto.

Figure 1A:
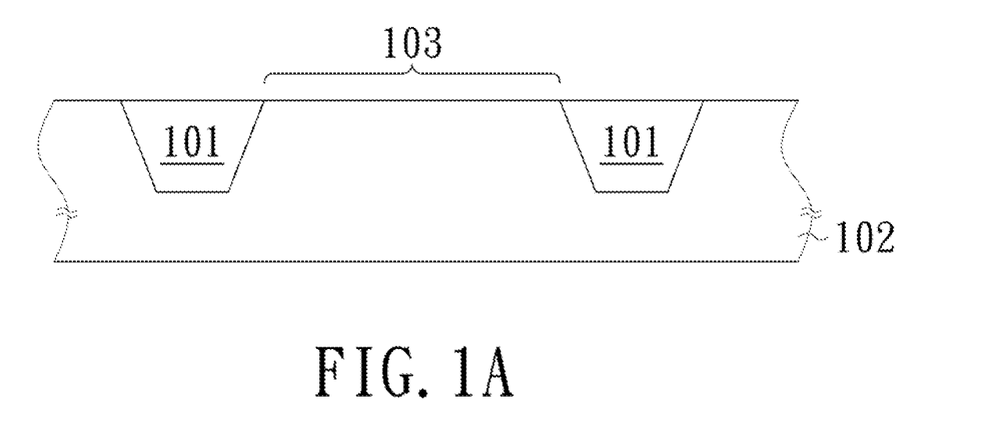
FIGS. 1A-1E illustrate cross-section views of a semiconductor device during the fabricating process thereof according to an embodiment of the present invention.

FIGS. 1A-1D illustrate cross-section views of a semiconductor device during the fabricating process thereof according to an embodiment of the present invention. Referring to FIG. 1A, a substrate 102, such as a silicon substrate, a silicon-containing substrate, or a silicon-on-insulator (SOI) substrate, with a plurality of isolation structures 101 formed therein is provided. Moreover, an active area 103 of the substrate 102 is defined by the isolation structures 101. Accordingly, the active area 103 is located between the isolation structures 101 and surrounded thereby. In this embodiment, the isolation structures 101 are, for example, shallow trench isolation (STI) structures.

Figure 1B:
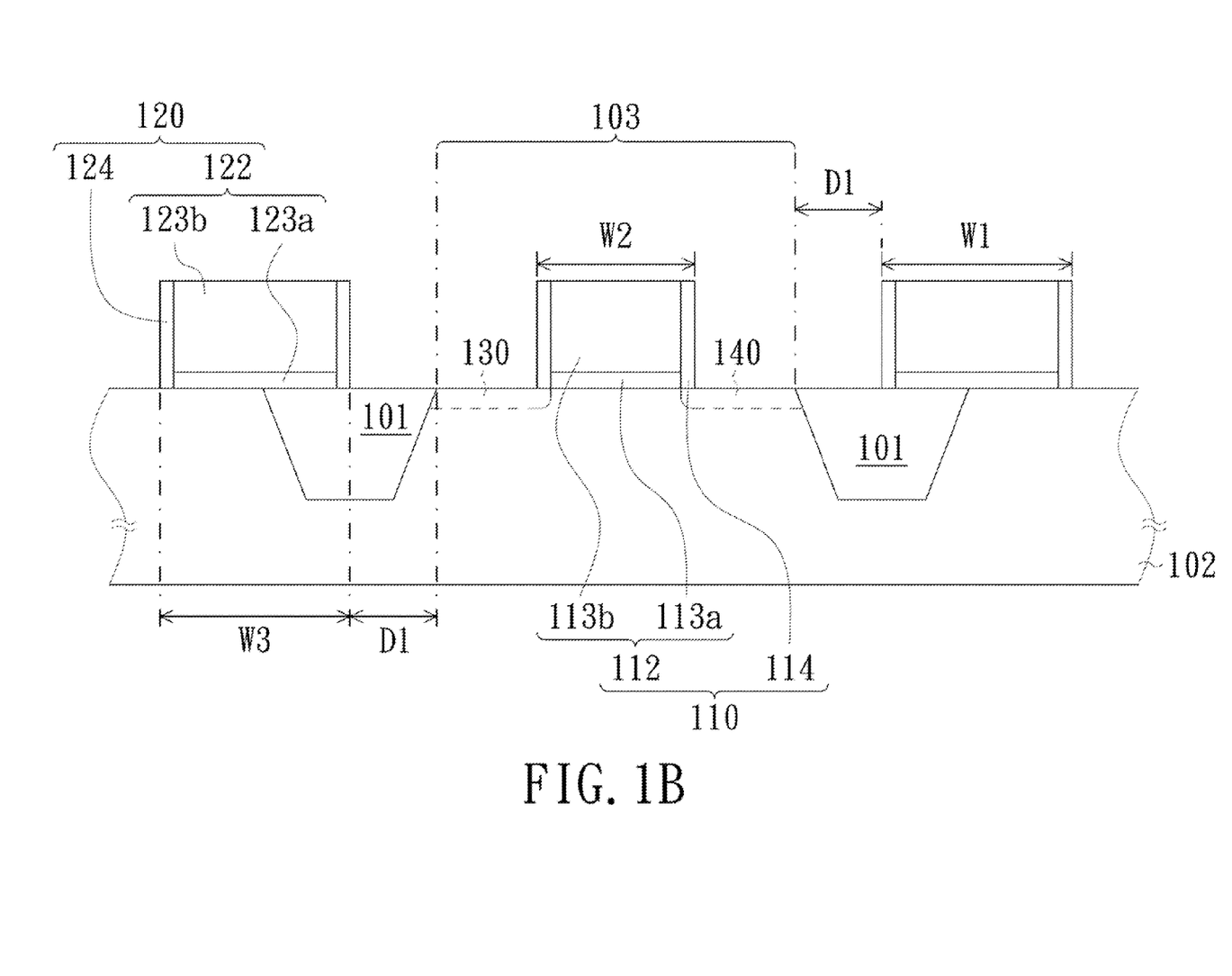

Referring to FIG. 1B, at least one gate structure 110 and a plurality of dummy gate structures 120 are formed on the substrate 102. In detail, the gate structure 110 is located within the active area 103 and the dummy gate structures 120 are located out of the active area 103. Further, the dummy gate structures 120 may be formed on the isolation structures 101, and the edge of each dummy gate structure 120 is separated from the boundary of the active area 103 with a distance D1. The distance D1 is small than 135 angstroms.

It should be noted that although the dummy gate structures 120 beside the gate structure 110 have the same distance D1 from the gate structure 110, but in actual, the process of forming the dummy gate structures 120 may resulted in alignment error. In this embodiment, the error value of the distance D1 is about 10 angstroms to 15 angstroms.

In this embodiment, the width W2 of the gate structure 110 is smaller than the width W3 of each dummy gate structure 120. Moreover, the gate structure 110 and the dummy gate structures 120 are formed during the same process and by using the same photo-mask. In the process of forming the gate structure 110 and the dummy gate structures 120, at least one gate stacked pattern 112 and a plurality of stacked structures 122 may be firstly formed on the substrate 102. In detail, the gate stacked pattern 112 is located within the active area 103 and the stacked structures 122 are located out of the active area 103. It is well-known that the gate stacked pattern 112 can be composed of a gate insulating layer 113a and a gate electrode 113b sequentially stacked on the substrate 102, and the stacked structures 122 can be composed of an insulating layer 123a and a dummy gate 123b sequentially stacked on the substrate 102. Moreover, the gate insulating layer 113a and the insulating layer 123a may be formed in the same process and the gate electrode 113b and the dummy gate 123b may be formed in the same process, but the invention is not limited hereto.

A sidewall insulating layer 114 is formed on two sides of the gate stacked pattern 112 and a sidewall insulating layer 124 is formed on two sides of each stacked structure 122. Accordingly, the sidewall insulating layer 114 and the gate stacked pattern 112 are composed of the gate structure 110, the spacers 124 and the stacked structures 122 are composed of the dummy gate structures 120. Furthermore, in this embodiment, an ion implantation process is performed after forming the sidewall insulating layer 114 and the sidewall insulating layer 124 to form a light doped drain (LDD) region 130 and a light doped drain region 140 in the substrate beside the gate stacked pattern 112.

It should be known that in other embodiment, the gate structure 110 and the dummy gate structures 120 may be formed in different processes.

Figure 1C:
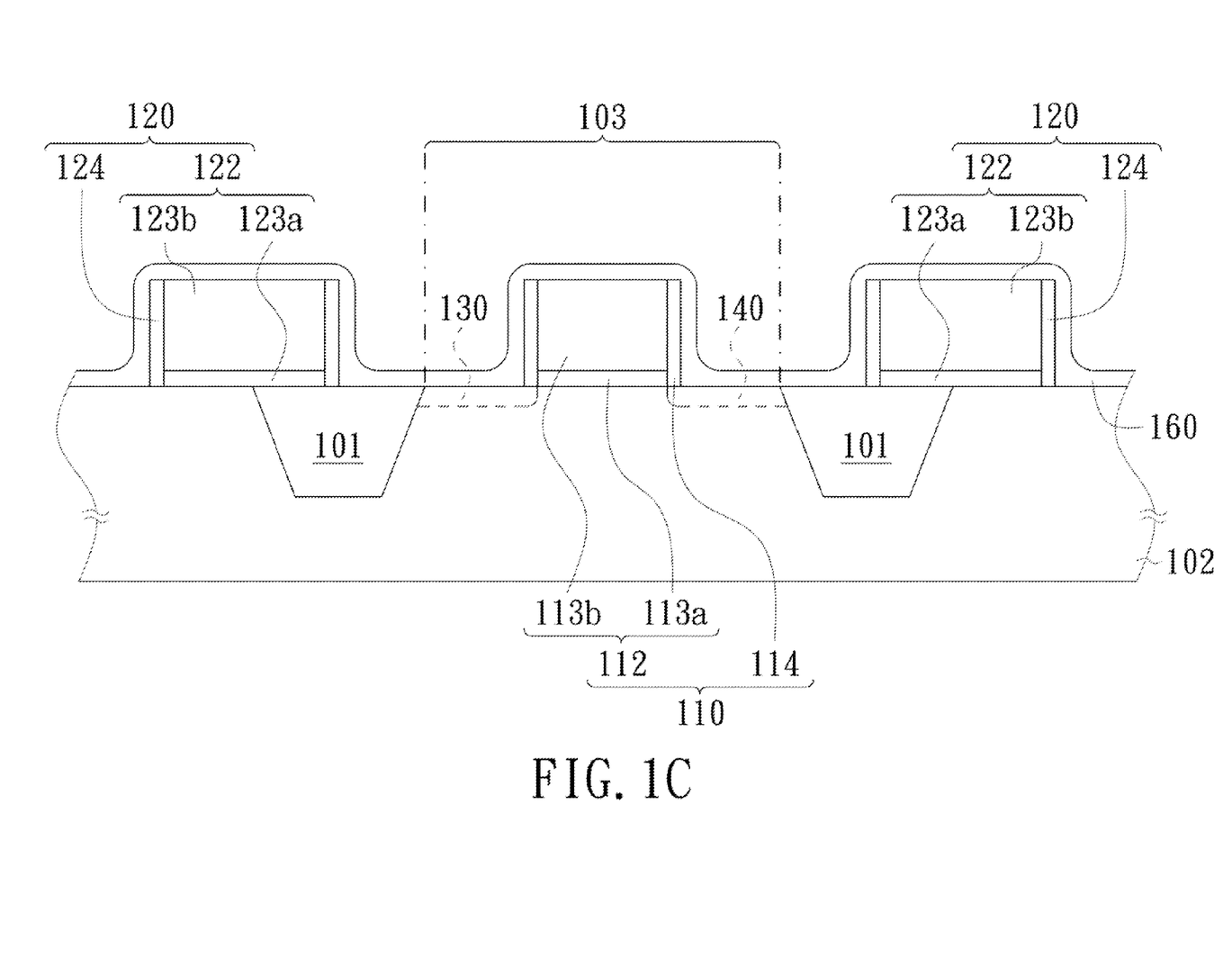
Figure 1D:
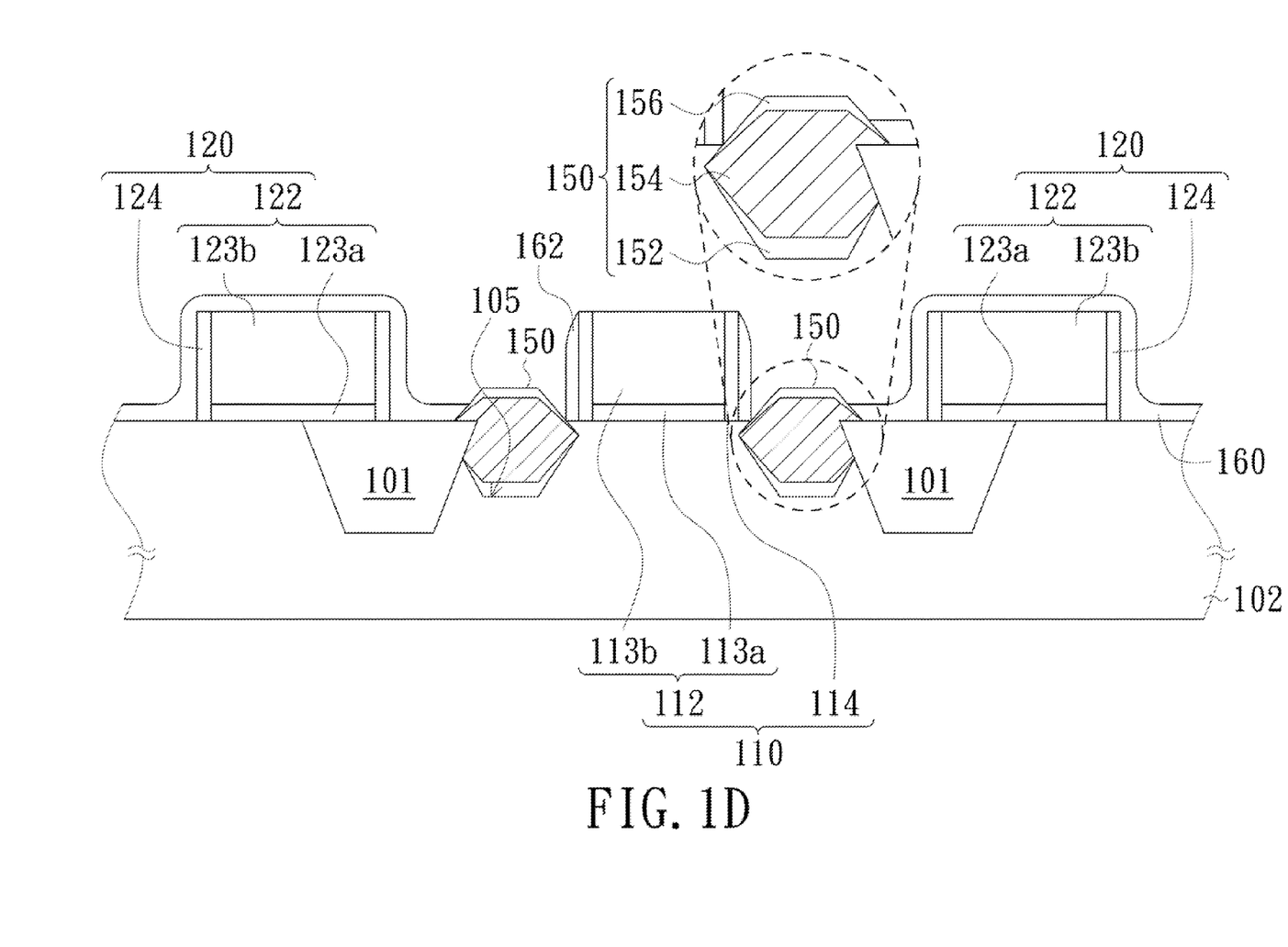
Figure 1E:
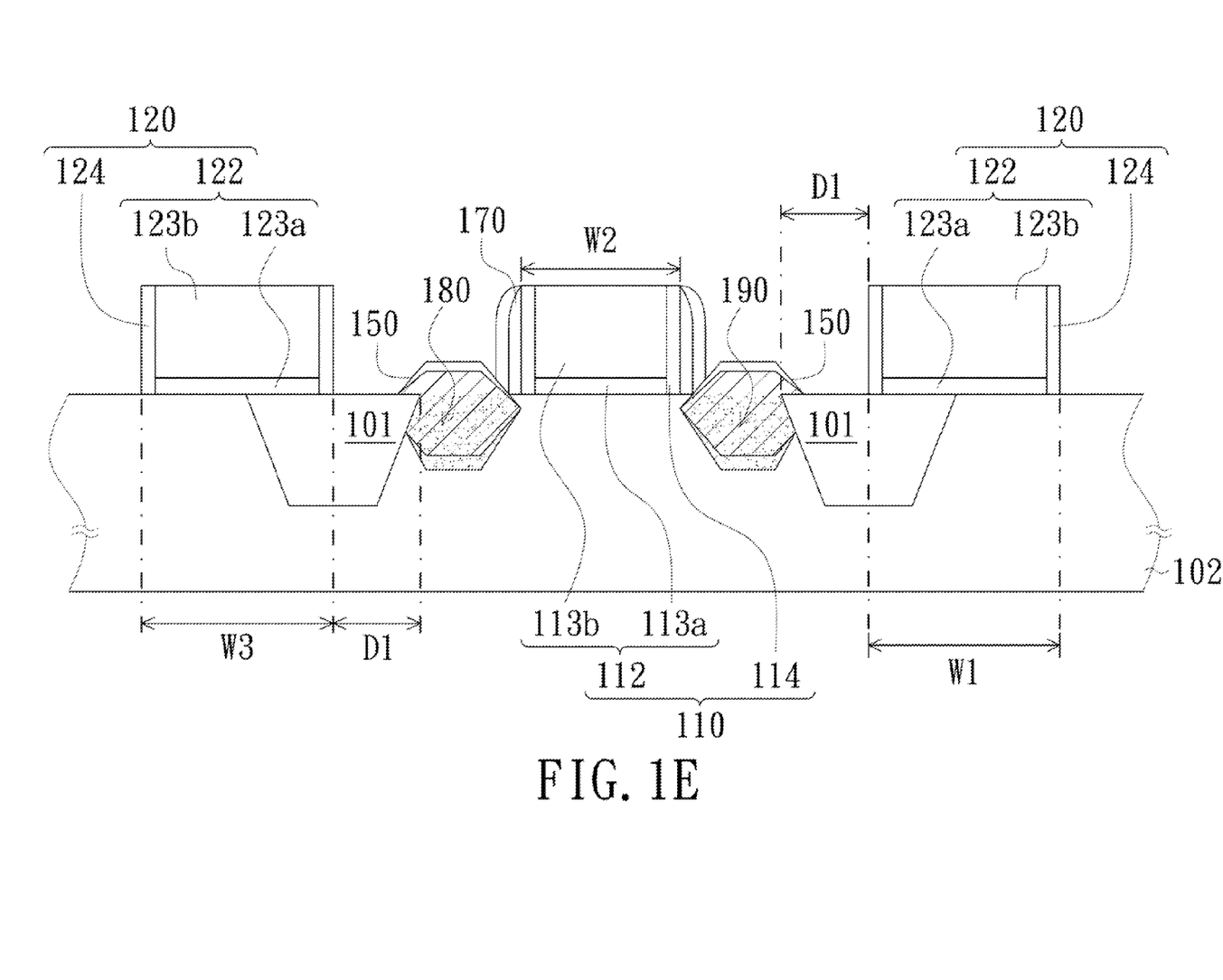

Referring to FIG. 1C to FIG. 1E, an epitaxial structures 150 are formed in the substrate 102 on two sides of the gate structure 110 within the active area 103, therefore a semiconductor device 100 is formed. In detail, as shown in FIG. 1C, a sacrificed material layer 160 is formed on the substrate 102 to cover the gate structure 110 and the dummy gate structure 120. Then, as shown in FIG. 1D, a portion of the sacrificed material layer 160 is removed to form a sacrificed spacer 162 and a portion of the substrate 102 is exposed. The removing process is proceeded for removing the exposed portion of the substrate 102 to form a plurality of trenches 105 within the active area 103 and beside the gate structure 110. Then, an epitaxial structure 150 is formed in each trench 105.

As aforementioned, the epitaxial structure 150 is, for example, formed by a selective epitaxial growth (SEG) process. Moreover, each epitaxial structure 150 can be composed of multi-layers formed by multi-level growing with different materials and concentrations. Specifically, each epitaxial structure 150 may includes an epitaxial buffer layer 152 and an epitaxial bulk layer 154 stacked on the substrates sequentially. A doping process can be performed selectively to dope the epitaxial buffer layers 152, and another doping process may be performed to dope the epitaxial bulk layers 154. In general, the doping concentrations of the epitaxial buffer layers 152 are smaller than that of the epitaxial bulk layers 154. Additionally, an epitaxial cap layer 156 may be selectively formed on each epitaxial bulk layer 154 and may be doped selectively.

The epitaxial structures 150 can be doped by in-situ process. Alternatively, the selective epitaxial growth process can be performed at first to form epitaxial structures 150 in the trenches 105, and then an ion implantation process is performed for doping the epitaxial structures 150 in the trenches 105, therefore the epitaxial structures 150 are formed. For example, when the semiconductor device 100 going to be formed is an N-type transistor, epitaxial layer containing SiC is formed as the epitaxial structures 150; when the semiconductor device 100 going to be formed is an P-type transistor, epitaxial layer containing SiGe is formed as the epitaxial structures 150. Accordingly, the stress effect between silicon-material of the substrate 102 and the epitaxial structure 150 can be used to increase carrier mobility. Therefore, the operation speed of the semiconductor device 100 may be improved.

Referring to FIG. 1E, an etching process may be performed after forming the epitaxial structures 150 for removing the sacrificed spacer 162 by using, for example, phosphoric acid. Then, a spacer 170 is formed on the sidewalls of the gate structure 110. Moreover, the spacer 170 can be single layer or multi-layer, and the materials of them may be silicon oxide, silicon nitride, silicon oxy-nitride or other dielectric materials. Afterwards, an ion implanting process can be performed to form a source region 180 and a drain region 190 in the epitaxial structures 150 respectively. It is noted that a pre-amorphization implanting process can be performed to implant indium ions, arsenic ions or germanium ions into the epitaxial structures 150 before forming the source region 180 and the drain region 190.

Additionally, the epitaxial structures 150 can be protruded from the top surface of the substrate 102 for increasing the pressure of the channel (not shown) of the semiconductor device and prevent the salicide formed later from closing to the junction between the source region 180 and the drain region 190, but the invention is not limited hereto.

The semiconductor device 100 fabricated by the aforementioned process would be described in detail in the following paragraphs.

Referring to FIG. 1E again, the semiconductor device 100 includes the substrate 102, the isolation structures 101, the gate structure 110, the dummy gate structures 120, the epitaxial structures 150. The substrate 102 is, for example, silicon substrate, a silicon-containing substrate, or a silicon-on-insulator (SOI) substrate. The isolation structures 101 are disposed in the substrate 102 and defining the active area 103. Accordingly, the active area 103 is located between the isolation structures 101 and surrounded by the isolation structures 101. The gate structure 110 and the dummy gate structures 120 are disposed on the substrate 102, and the gate structure 110 is located within the active area 103, the dummy gate structures 120 are located out of the active area 103. Further, the edge of each dummy gate structures 120 is separated from the boundary of the active area 103 with the distance D1, and the distance D1 is smaller than 135 angstroms.

Furthermore, in this embodiment, the gate structure 110 is composed of the gate stacked pattern 112 and the sidewall insulating layer 114 and the spacer 170 is formed on the sidewalls of the gate structure 110. The dummy gate structure 120 is composed of the stacked structure 122 and the sidewall insulating layer 124.

The epitaxial structures 150 are respectively disposed in the substrate 102 on two sides of the gate structure 110 and within the active area 103. In this embodiment, each epitaxial structure 150 is composed of the epitaxial buffer layer 152 and the epitaxial bulk layer 154 stacked on the substrate 102 in sequence. The epitaxial buffer layer 152 can be selectively doped with dopant, such as boron or germanium, with lower concentration and the epitaxial bulk layer 154 is doped with higher concentration.

Before forming the epitaxial structures 150, a portion of the substrate 102 is removed to form the trenches 105 beside the gate structure 110, and then epitaxial structures 150 are respectively formed in different trenches 105. Since the edge of each dummy gate structure 120 of this embodiment is separated from the boundary of the active area 103 with the distance D1 smaller than 135 angstroms, it can prevent the isolation structures 101 from over-etching during the process of etching the portion of the substrate 102 to form the trenches 105. Therefore, the symmetries of the epitaxial structures 150 formed in the trenches 105 can be improved.

Figure 2:
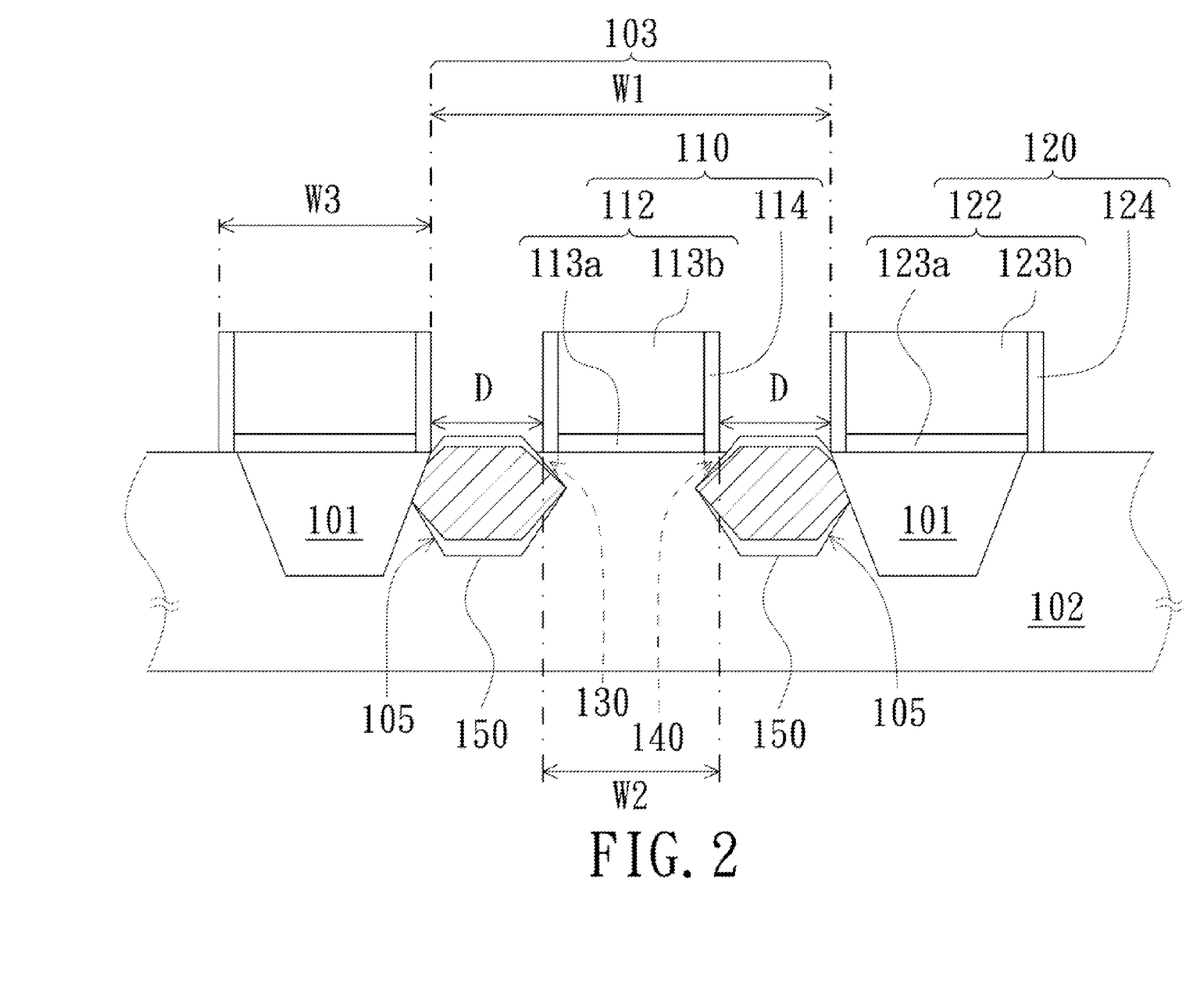
FIG. 2 illustrates a cross-section view of a semiconductor device according to another embodiment of the present invention.

In other embodiment, as shown in FIG. 2, the edge of each dummy gate structure 120 may align to the boundary of the active area 103 $\dot{z}$ boundary. That is, the edge of each dummy gate structures 120 may align to the edge of the corresponding isolation structure 101. Alternatively, as shown in FIG. 3, the dummy gate structures 120 may cross on the border between the active area 103 and the isolation structures 101 and partly located in the active area 103.

Figure 3:
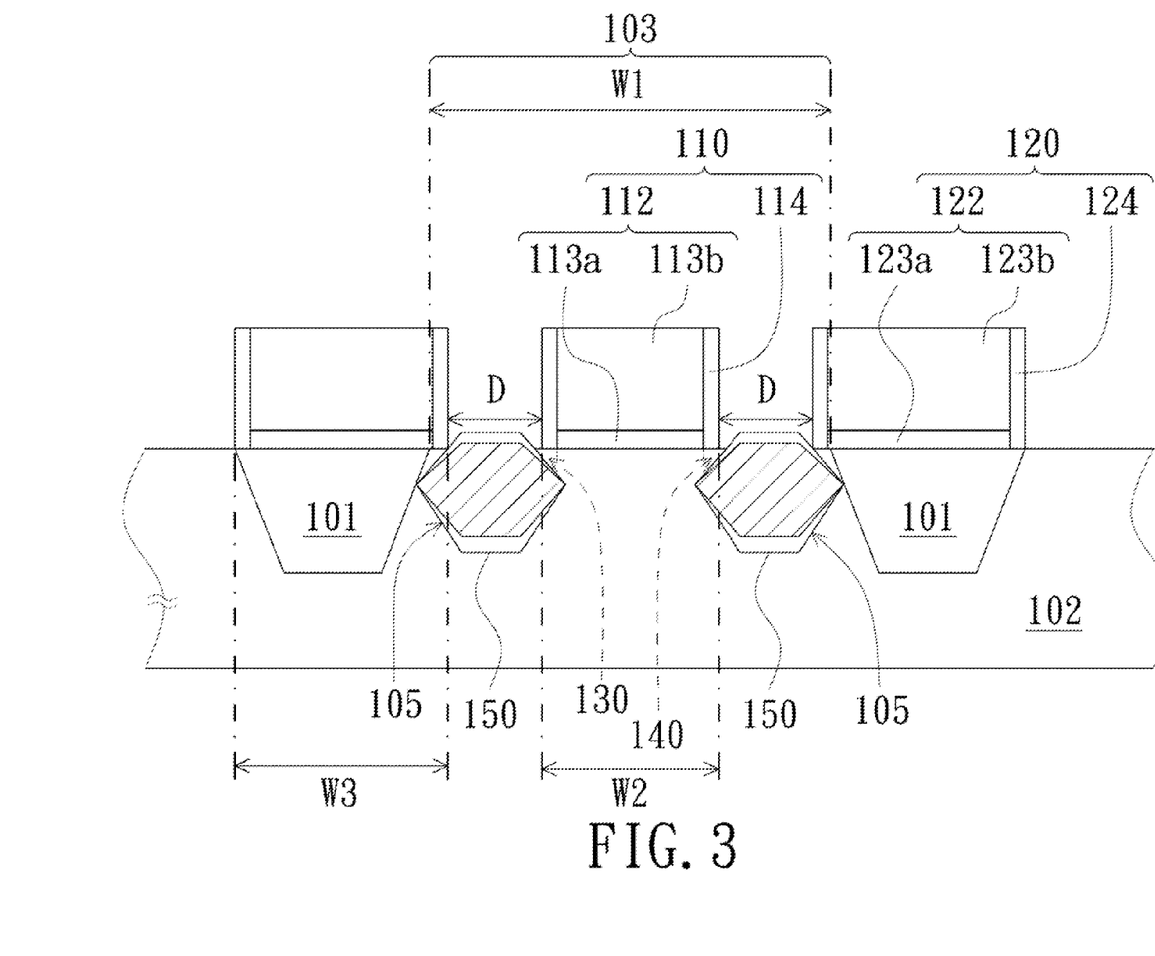
FIG. 3 illustrates a cross-section view of a semiconductor device according to another embodiment of the present invention.

As shown in FIG. 2 and FIG. 3, the active area 103 has a first width W1, the gate structure 110 has a second width W2 and the edge of each dummy gate structure 120 is separated from the edge of the gate structure 110 with a distance D. In the semiconductor device 200 shown in FIG. 2, the edge of each dummy gate structure 120 is aligned to the boundary of the active area 103, so that W1, W2 and D satisfy the equation: W1=W2+2D. In the semiconductor device 300 shown in FIG. 3, the dummy gate structures 120 cross on the border between the active area 103 and the isolation structures 101 and partly located in the active area 103, therefore W1, W2 and D satisfy the inequality: W1>W2+2D.

Although in this embodiment, the distances between the dummy gate structures 120 and the gate structure 110 are looked upon as the same distance D, but in actual, the process of forming the dummy gate structures 120 resulted in alignment error, therefore the distances between the gate structure 110 and each dummy gate structure 120 would has a tiny error value E. Accordingly, the dimensions of the elements of the semiconductor device 200 shown in FIG. 2 satisfy the equation: W1=W2+2D±E, and the dimensions of the elements of the semiconductor device 300 shown in FIG. 3 satisfy the inequality: W1>W2+2D±E. In this embodiment, the error value E is about 10 angstroms to 15 angstroms.

In the embodiments shown in FIG. 2 and FIG. 3, the edge of each dummy gate structures 120 covers the boundary of the corresponding isolation structure 101, therefore, the dummy gate structures 120 and the gate structure 110 can be used as etch mask to remove portions of the substrate 102 between the gate structure 110 and the dummy gate structures 120 for forming the trenches 105. Accordingly, the isolation structures 101 at the border between the isolation structures 101 and the active area 103 can be prevented from being over-etched and the shapes of the trenches 105 can be under-controlled. Therefore, the epitaxial structures 150 symmetric to each other are formed in the trenches 105. Consequently, the semiconductor device 200 and the semiconductor device 300 have symmetric source 130 and symmetric drain structure 150, so that the epitaxial structures 150 can cause proper stress effect to increase the carrier mobility.

Figure 4:
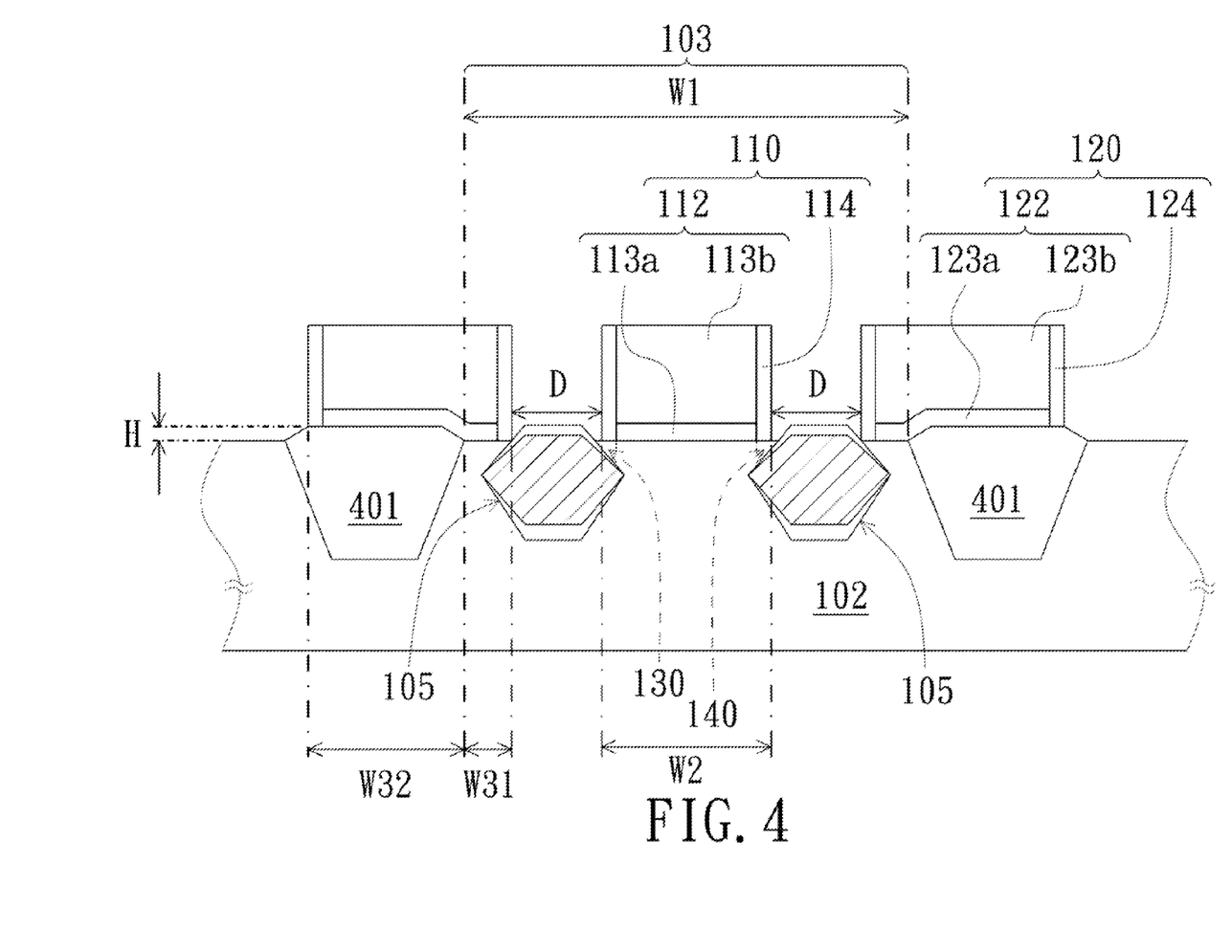
FIG. 4 illustrates a cross-section view of a semiconductor device according to another embodiment of the present invention.

FIG. 4 illustrates a cross-section view of a semiconductor device according to another embodiment of the present invention. Referring to FIG. 4, the difference between this embodiment and the mentioned embodiments is that the isolation structures 401 of the semiconductor device 400 are protrusive from the surface of the substrate 102 with a step height H. When one of the dummy gate structures 120 crosses on the border between the isolation structures 401 and the active area 103, the width W31 of the overlap portion of the dummy gate structure 120 between the dummy gate structure 120 and the active area 103 is equal to or greater than three times step height H. Furthermore, the width W32 of the non-overlap portion of the dummy gate structure 120 may also be equal to or greater than three times step height H. Accordingly, the dummy gate structures 120 can avoid breaking caused by crossing on the step height H.

In summary, the distance between the dummy gate structures and the active area of the semiconductor device of one embodiment of the invention is smaller than 135 angstroms. Alternatively, the dummy gate structures can further cross on the border between the active area and the isolation structures. Therefore, during the process for forming the epitaxial structures beside the gate structure, the dummy gate structures can used for protecting the isolation structures from over-etching at the border between the active area and the isolation structures. Accordingly, it is not only that the symmetric trenches on two sides of the gate structure can be formed, but the symmetric epitaxial structures also can be formed in the trenches to be the source and drain. Therefore, the operation performance of the semiconductor device can be improved.

The above description is given by way of example, and not limitation. Given the above disclosure, one skilled in the art could devise variations that are within the scope and spirit of the invention disclosed herein, including configurations ways of the recessed portions and materials and/or designs of the attaching structures. Further, the various features of the embodiments disclosed herein can be used alone, or in varying combinations with each other and are not intended to be limited to the specific combination described herein. Thus, the scope of the claims is not to be limited by the illustrated embodiments.

What is claimed is:

1. A semiconductor device, comprising:
   a substrate with an active area having a first width W1,
   a plurality of isolation structures disposed within the substrate and surrounding the active area;
   at least one gate structure with a second width W2 disposed on the substrate and within the active area;
   a plurality of dummy gate structures disposed on the substrate and partly covering the isolation structures, each dummy gate structure separated from the gate structure with a distance D, and the first width W1, the second width W2 and the distance D satisfying an inequality: W1≥W2+2D; and
   a plurality of epitaxial structures disposed within the active area and in a portion of the substrate on two sides of the gate structure.

2. The semiconductor device recited in claim 1, wherein each dummy gate structure has a third width W3 greater than the second width W2.

3. The semiconductor device recited in claim 1, wherein the gate structure comprises:
   a gate stacked pattern disposed on the substrate; and a sidewall insulating layer disposed on the sidewalls of the gate stacked pattern.

4. The semiconductor device recited in claim 1, wherein the isolation structures are protrusive from the substrate with a step height, and when W1>W2+2D, a width of a portion of each dummy gate structure overlapping the active area is equal to or greater than three times the step height.

5. The semiconductor device recited in claim 4, wherein when W1>W2+2D, a width of another portion of each dummy gate structure non-overlapping the active area is equal to or greater than three times the step height.

6. The semiconductor device recited in claim 1, wherein the substrate further has a plurality of trenches, and the epitaxial structures are disposed in the trenches, each epitaxial structure comprises:
   an epitaxial buffer layer disposed in the corresponding trenches; and
   an epitaxial bulk layer disposed on the epitaxial layer.

7. The semiconductor device recited in claim 6, wherein the doping concentration of the epitaxial buffer layers is smaller than that of the epitaxial bulk layers.

8. The semiconductor device recited in claim 6, wherein each epitaxial structure further comprises an epitaxial cap layer disposed on the epitaxial bulk layer.

9. The semiconductor device recited in claim 1, further comprising:
   a spacer disposed on the sidewalls of the gate structure; and
   a source region and a drain region respectively disposed in the epitaxial structures beside the spacer.

10. A semiconductor device, comprising:
    a substrate with an active area;
    a plurality of isolation structures disposed within the substrate and surrounding the active area;
    at least one gate structure disposed on the substrate and within the active area;
    a plurality of dummy gate structures disposed on the substrate and located out of the active area, the edges of the dummy gate structures separated from the boundary of the active area with a distance smaller than 135 angstroms; and
    a plurality of epitaxial structures disposed in a portion of the substrate between the gate structure and the dummy gate structures.

11. The semiconductor device recited in claim 10, wherein the width of each dummy gate structure is greater than that of the gate structure.

* * * * *